United States Patent
Derai et al.

(10) Patent No.: US 10,818,578 B2
(45) Date of Patent: Oct. 27, 2020

(54) METHOD OF MANUFACTURING SEMICONDUCTOR DEVICES, CORRESPONDING DEVICE AND CIRCUIT

(71) Applicant: STMICROELECTRONICS S.R.L., Agrate Brianza (IT)

(72) Inventors: Michele Derai, Milan (IT); Federico Giovanni Ziglioli, Pozzo d'Adda (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/151,748

(22) Filed: Oct. 4, 2018

(65) Prior Publication Data

US 2019/0115287 A1  Apr. 18, 2019

(30) Foreign Application Priority Data

Oct. 12, 2017  (IT) .......................... 102017000115345

(51) Int. Cl.
*H01L 23/495* (2006.01)
*H01L 23/31* (2006.01)
(Continued)

(52) U.S. Cl.
CPC ...... *H01L 23/49527* (2013.01); *H01L 21/561* (2013.01); *H01L 23/3135* (2013.01);
(Continued)

(58) Field of Classification Search
CPC ......... H01L 23/49527; H01L 23/49575; H01L 23/49582; H01L 23/49589; H01L 23/3135; H01L 23/3121; H01L 23/49541; H01L 23/49548; H01L 23/40558; H01L 23/3157; H01L 23/495; H01L 2224/1111;
(Continued)

(56) References Cited

U.S. PATENT DOCUMENTS

| 2012/0120623 A1* | 5/2012 | Baek | H05K 7/1061 |
| | | | 361/767 |
| 2015/0279778 A1* | 10/2015 | Camacho | H01L 21/56 |
| | | | 257/737 |
| 2017/0077043 A1* | 3/2017 | Takemura | C09D 183/14 |

FOREIGN PATENT DOCUMENTS

| JP | 2009-16711 A | 1/2009 |
| WO | 2015003175 A1 | 1/2015 |

OTHER PUBLICATIONS

"Supplementary: Customised Lead-Frame", accessed on Jun. 26, 2017, 10 pages, at http://www.mtarr.co.uk/courses/topics/0264_csp/supplementary/sup_01.html.

* cited by examiner

*Primary Examiner* — Jasmine J Clark
(74) *Attorney, Agent, or Firm* — Seed Intellectual Property Law Group LLP

(57) ABSTRACT

A method of manufacturing semiconductor devices such as integrated circuits comprises: providing one or more semiconductor chips having first and second opposed surfaces, coupling the semiconductor chip or chips with a support substrate with the second surface towards the support substrate, embedding the semiconductor chip or chips coupled with the support substrate in electrically-insulating packaging material by providing in the packaging material electrically-conductive passageways. The electrically-conductive passageways comprise: electrically-conductive chip passageways towards the first surface of the at least one semiconductor chip, and/or electrically-conductive substrate passageways towards the support substrate.

19 Claims, 15 Drawing Sheets

(51) Int. Cl.
*H01L 23/00* (2006.01)
*H01L 21/56* (2006.01)

(52) U.S. Cl.
CPC .. *H01L 23/49575* (2013.01); *H01L 23/49582* (2013.01); *H01L 23/49589* (2013.01); *H01L 24/24* (2013.01); *H01L 24/25* (2013.01); *H01L 24/32* (2013.01); *H01L 24/48* (2013.01); *H01L 24/73* (2013.01); *H01L 24/82* (2013.01); *H01L 24/92* (2013.01); *H01L 24/97* (2013.01); *H01L 24/16* (2013.01); *H01L 24/45* (2013.01); *H01L 24/83* (2013.01); *H01L 2224/04105* (2013.01); *H01L 2224/16227* (2013.01); *H01L 2224/16245* (2013.01); *H01L 2224/24105* (2013.01); *H01L 2224/24175* (2013.01); *H01L 2224/24246* (2013.01); *H01L 2224/24265* (2013.01); *H01L 2224/25171* (2013.01); *H01L 2224/32245* (2013.01); *H01L 2224/45014* (2013.01); *H01L 2224/48091* (2013.01); *H01L 2224/48175* (2013.01); *H01L 2224/48247* (2013.01); *H01L 2224/48257* (2013.01); *H01L 2224/73227* (2013.01); *H01L 2224/73265* (2013.01); *H01L 2224/73267* (2013.01); *H01L 2224/82039* (2013.01); *H01L 2224/82047* (2013.01); *H01L 2224/83192* (2013.01); *H01L 2224/92164* (2013.01); *H01L 2224/92244* (2013.01); *H01L 2224/92247* (2013.01); *H01L 2224/97* (2013.01); *H01L 2924/00014* (2013.01); *H01L 2924/13091* (2013.01); *H01L 2924/1815* (2013.01); *H01L 2924/19041* (2013.01)

(58) Field of Classification Search
CPC . H01L 2224/17515; H01L 2224/16055; H01L 2224/16501; H01L 2224/13147; H01L 2224/16058; H01L 2224/16245; H01L 2224/81801; H01L 2924/3656; H01L 2924/014; H01L 2924/0105; H01L 2924/01047; H01L 24/16; H01L 24/13; H01L 24/17; H01L 24/11; H01L 24/81; H01L 24/4828; H01L 24/565; H01L 2924/19041; H01L 2224/25171; H01L 2224/24265; H01L 2224/04105; H01L 2924/13091
See application file for complete search history.

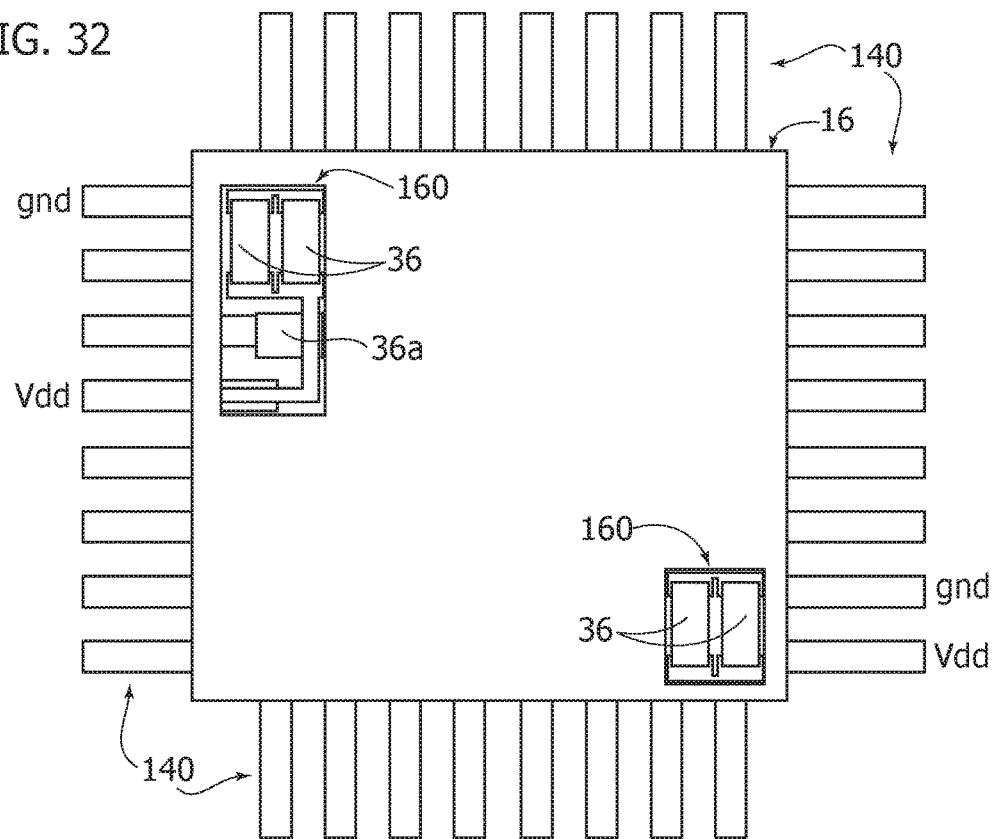
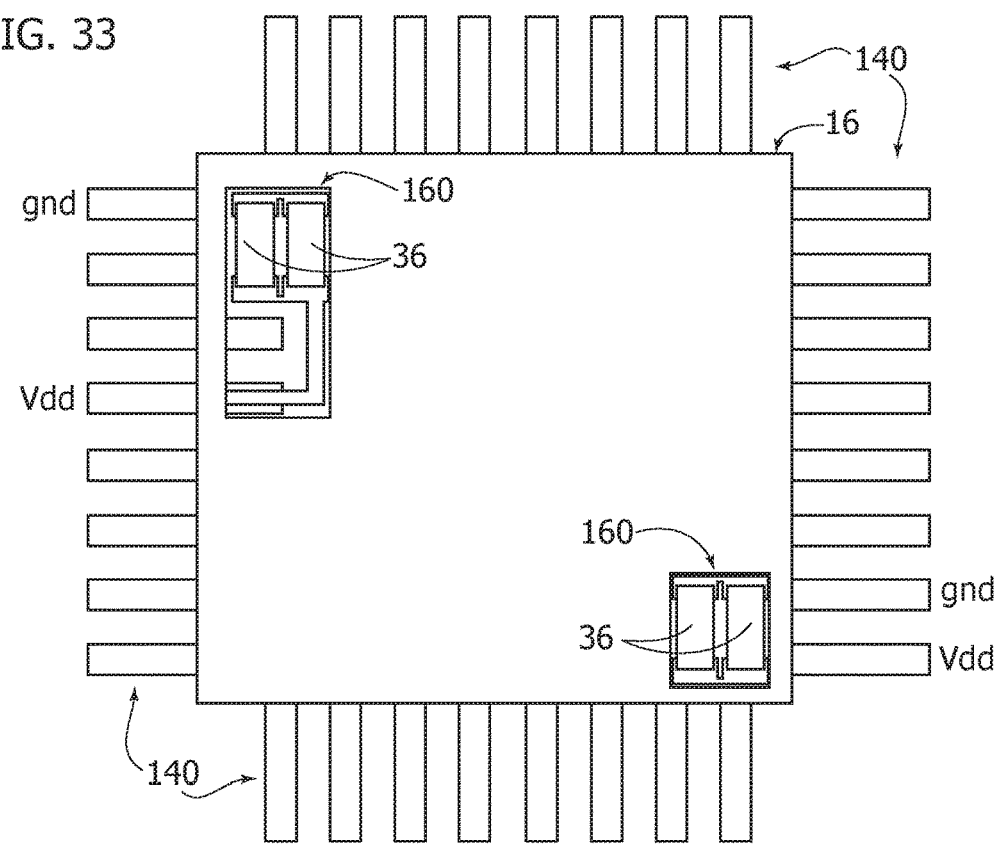

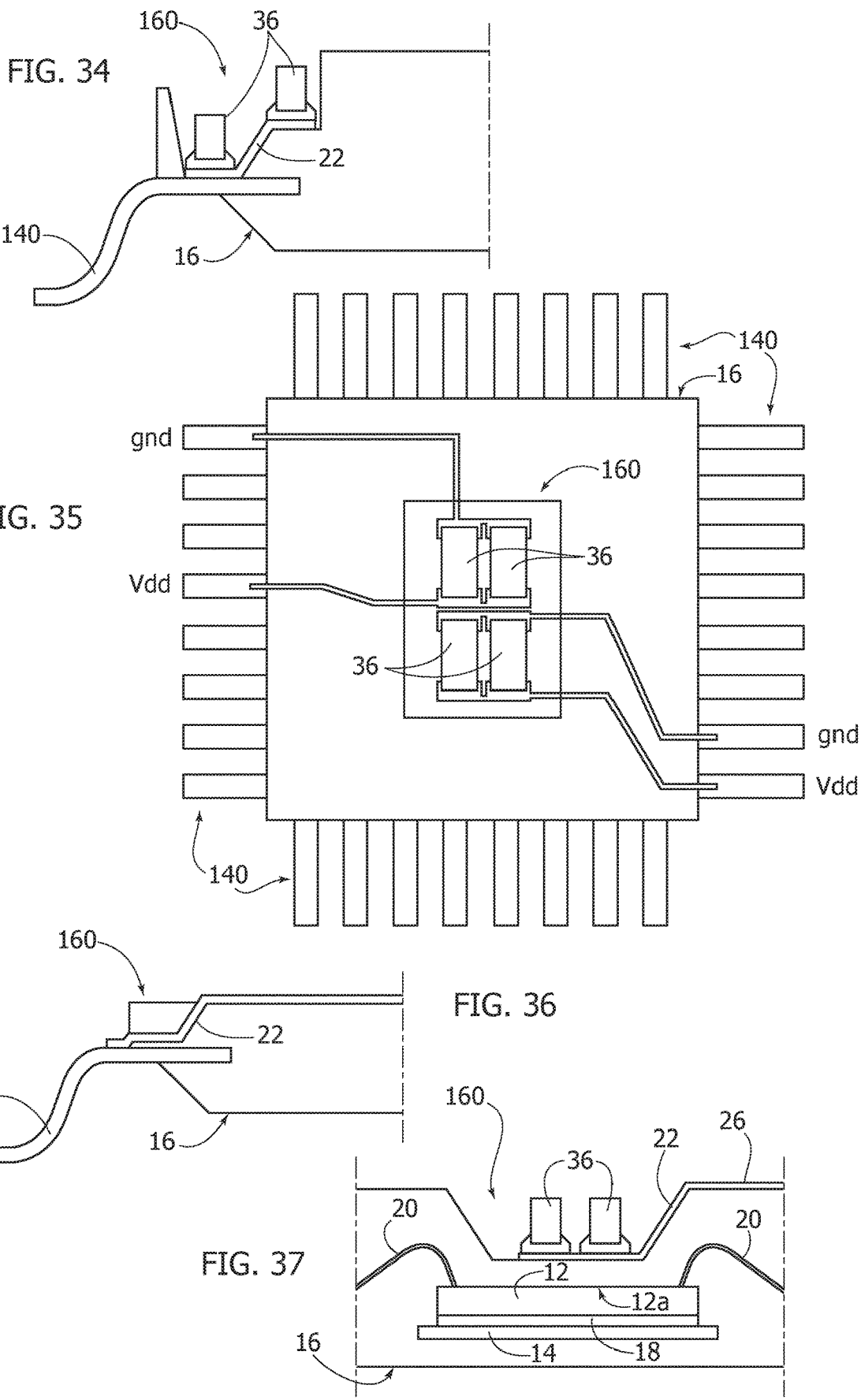

METHOD OF MANUFACTURING SEMICONDUCTOR DEVICES, CORRESPONDING DEVICE AND CIRCUIT

BACKGROUND

Technical Field

The description relates to manufacturing semiconductor devices.

Description of the Related Art

Manufacturing semiconductor devices, such as, e.g., integrated circuits (ICs), is an area of technology which has attracted extensive research activity, as witnessed in the technical and patent literature.

Despite the extensive activity in that area, further improved solutions are desirable.

BRIEF SUMMARY

One or more embodiments may relate to a corresponding device and/or corresponding circuit. One or more embodiments may be applied to manufacturing integrated circuits (ICs), e.g., of the type comprising a so-called QFN (Quad Flat No-Leads) package.

The claims are an integral part of the technical disclosure provided herein in connection with the embodiments.

One or more embodiments may provide various types of improvement, e.g., in semiconductor device packages comprising plural layers of molding.

For instance, one or more embodiments may:
  facilitate reducing or removing wiring from packages, such as QFN packages;
  increase flexibility in terms of current distribution (e.g., at redistribution layer level) and/or integrating passive components in a package;
  lead to improvements in performance of transistor components, such as MOSFET transistors;
  facilitate leaving metal contact portions exposed for thermal dissipation (e.g., for soldering on a PCB substrate); and/or
  facilitate reducing mechanical stress on device pads and/or loosening active area restrictions.

BRIEF DESCRIPTION OF THE SEVERAL VIEWS OF THE DRAWINGS

One or more embodiments will now be described, by way of example only, with reference to the annexed figures, wherein:

FIGS. 32 and 33 are plan views of a semiconductor device exemplary of possible features of various embodiments, FIG. 34 is a partial cross-sectional view of a semiconductor device as exemplified in FIG. 33, FIG. 35 is a plan view of a semiconductor device exemplary of possible features of at least one an embodiment, and FIGS. 36 and 37 are cross-sectional views (a partial one in the case of FIG. 36) along lines A-A and B-B of FIG. 35.

It will be appreciated that for the sake of clarity and ease of understanding the various figures may not be drawn to a same scale.

It will be similarly appreciated that features illustrated (singly or in combination) in connection with embodiments as exemplified in any one of the figures can be applied (singly or in combination) in connection with embodiments as exemplified in any other of the figures.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Various designations current in the semiconductor industry will appear throughout the instant description of exemplary embodiments.

The meaning of certain ones of these designations is recalled here by way of introduction to the description of examples of embodiments.

QFN package (Quad Flat No-Leads): a semiconductor product package that has leads incorporated in bottom side of molding compound.

LDS (Laser Direct Structuring): a laser machining technology which permits production of electrically-conductive formations (e.g., vias and lines) in a molding compound.

RDL (ReDistribution Layer): an extra metal layer on a semiconductor chip that makes the input/output (I/O) pads in a semiconductor device, such as an integrated circuit, available at other locations.

Passive component: an electronic component not intended to introduce energy into a circuit; resistors, capacitors, inductors are exemplary of passive components.

Ribbon: a metal plate interconnection able to carry high currents.

Figure 1:
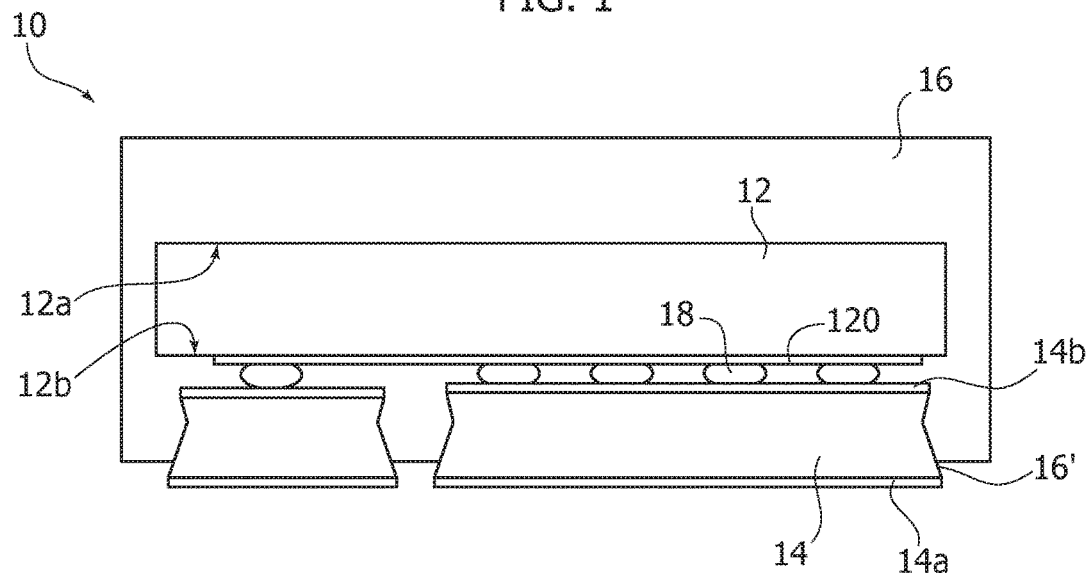
FIG. 1 is a cross-sectional view of a semiconductor device exemplary of possible parts therein.

FIG. 1 is a cross-sectional view of a semiconductor device (e.g., an integrated circuit or IC) showing possible parts/elements therein.

In the exemplary case presented in FIG. 1, a semiconductor device 10 may comprise a semiconductor die or chip 12 arranged on a leadframe 14 (possibly comprising a die pad surrounded by an array of electrically-conductive leads to provide electrically-conductive paths to and from the semiconductor die or chip 12) and an electrically-insulating package 16 comprising one or more molding compounds. The semiconductor chip or die 12 includes one or more electrical components, such as integrated circuits. The electrically-insulating package 16 is an LDS material, such as an LDS molding compound.

As well known to those of skill in the art, a semiconductor device 10 as exemplified in FIG. 1 may comprise various other parts or elements such as (by way of non-limited example):

leadframe bottom and top finishing 14a and 14b, a RDL (ReDistribution Layer) 120, e.g., Cu, a connection (attachment) 18 of the semiconductor chip or die 12 on the leadframe 14, possibly comprising or consisting of electrically-conductive formations, e.g., spheres or balls.

Also, the package 16 may be formed in such a way that the leadframe 14/leadframe bottom finishing 14a slightly protrude from the package 16 to provide a so-called "standoff" gap 16'.

As similarly well known to those of skilled in the art, semiconductor devices, such as the device 10 exemplified in FIG. 1, may comprise fewer or more parts/elements than those exemplified in FIG. 1, while one or more of the parts exemplified in FIG. 1 can be replaced by other parts/elements In arrangements as exemplified in FIG. 1 the semiconductor die or chip 12 may be regarded as having a first ("top" or "front") surface 12a, and a second ("bottom" or "back") surface 12b towards the leadframe 14, which may act as a supporting substrate for the semiconductor die or chip 12.

Throughout the figures annexed to the instant description, parts or elements like parts or elements introduced in connection with FIG. 1 will be indicated with like references, and a corresponding description will not be repeated for the sake of brevity. Also, in order to avoid making the graphical representation unnecessarily complicated, certain parts or elements visible/referenced in one figure may not be visible/referenced in other figures.

A device as exemplified in FIG. 1 may be referred to as a semiconductor device of the "QFN" package type, QFN being, as noted previously, a current acronym for Quad Flat No-Leads.

It is noted that a QFN package as exemplified in FIG. 1 (this being, e.g., the case of a so-called flip-chip QFN package) may have a limitation due to the first (top or front) surface of the die 12 being unavailable for connection to a mounting substrate S (e.g., of the Printed Circuit Board—PCB type), e.g., for power dissipation.

Figure 2:
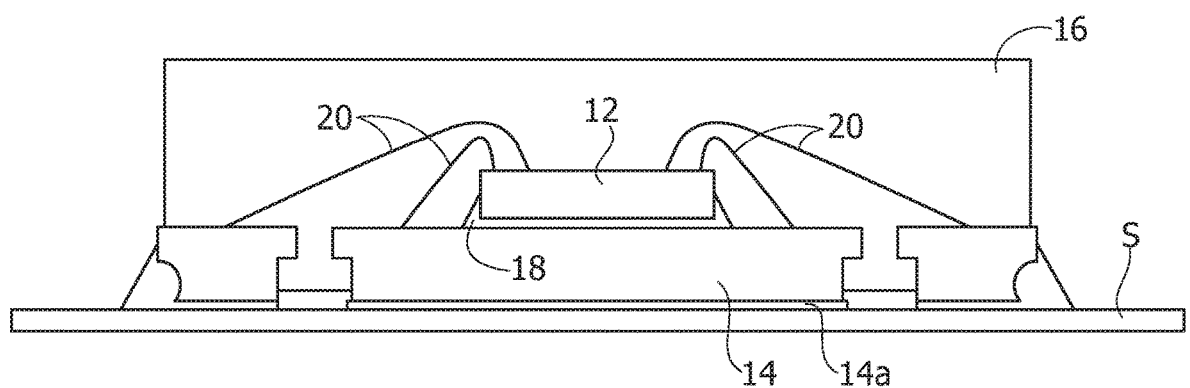
FIG. 2 is a further cross-sectional view of a semiconductor device.

FIG. 2 is exemplary of a semiconductor device 10 (shown mounted on a substrate S, e.g., PCB) adopting, in an arrangement essentially corresponding to the structure exemplified in FIG. 1, a so-called wire-bonding layout (e.g., metallic wires) 20 in order to provide electrical connection between contact pads (not visible in the figures) provided at the top or front surface 12a of the die 12 and the leadframe 14.

Providing a wire bonding layout may represent a critical process step making alternative solutions desirable.

Figure 3:
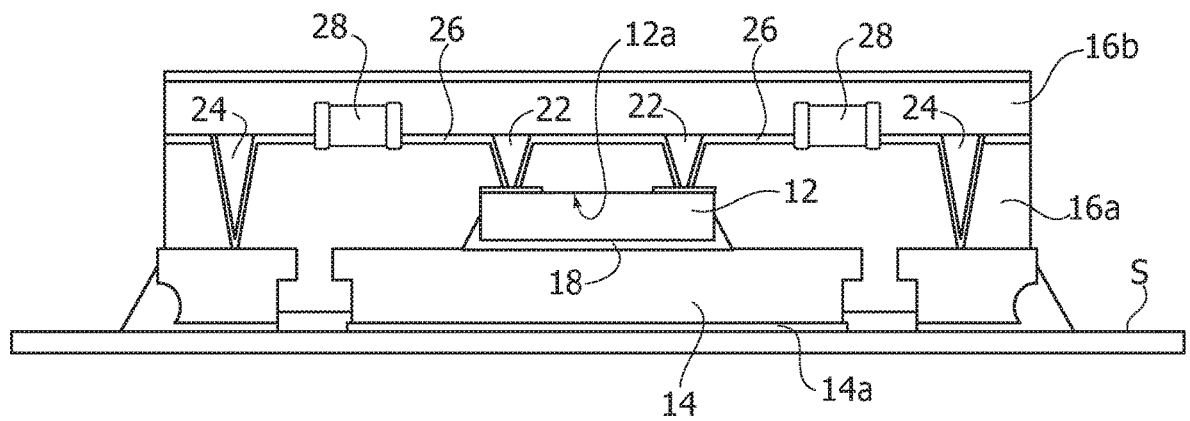
FIG. 3 is exemplary of possible features of at least one an embodiment, FIG. 4 comprises portions indicated a) to i) which are exemplary of possible acts or steps which may be used in various embodiments.

One or more embodiments as exemplified in FIG. 3 exploit the possibility of providing in the (electrically insulating) packaging material 16 electrically-conductive passageways comprising either or both of:

first electrically-conductive or "chip" passageways extending through the packaging molding compound towards (possibly, but not necessarily contacting) the first surface 12a of the semiconductor chip 12, and/or second electrically-conductive or "substrate" passageways extending through the packaging molding compound towards (possibly, but not necessarily contacting) the leadframe 14 (e.g., leads 140 therein) acting as a support substrate for the chip 12.

As discussed in the following, various technological solutions may be adopted in order to provide such electrically-conductive passageways 22, 24, namely channels through or by which an electrical current may pass.

In one or more embodiments, electrically-conductive lines 26 may be provided to electrically couple, e.g., by extending bridge-like therebetween, certain ones (that is, not necessarily all) of the chip passageways 22 and certain ones (that is, not necessarily all) of the substrate passageways 24 provided in the packaging material 16.

In one or more embodiments, passive components 28 (e.g., as defined previously, comprising capacitors, as exemplified in connection with FIGS. 24 to 37) may be coupled to any of the passageways 22 and/or 24 or the electrically-conductive lines 26.

FIG. 3 exemplifies the possibility of arranging such components 28 at intermediate positions in the conductive lines 26. Such an arrangement is otherwise non-mandatory, insofar as the components 28 can be (electrically) coupled also with the passageways 22 and/or 24.

In one or more embodiments, the passageways 22, 24 can be produced, e.g., by providing (e.g., by drilling) vias extending through the packaging material (molding compound) 16, with possible subsequent processing (e.g., metallization) to facilitate obtaining/increasing electrical conductivity as desired. In some embodiments, the passageways 22, 24 are filled completely with conductive material, while in other embodiments, the passageways 22, 24 are lined with conductive material. The passageways lined with conductive material may then be filled with another material. The conductive material in the passageways 22, 24 are coupled to conductive lines 26.

FIG. 3 is exemplary of embodiments wherein the packaging material 16 is provided with a layered structure comprising, e.g., a first layer 16a located proximally (that is, adjacent) to the support substrate 14 (e.g., the leadframe) and a second layer 16b arranged distally (that is, away) from the support substrate 14, e.g., with the first layer 16a sandwiched between the support substrate 14 and the second, distal layer 16b.

In one or more embodiments as exemplified in FIG. 3, the passageways 22, 24 may be provided extending through the proximal layer 16a of the packaging material while the distal layer 16b is (at least substantially) exempt from such passageways, with the (passive) components 28 embedded therein.

In one or more embodiments as exemplified in FIG. 3, the electrically-conductive lines 26 between the passageways 22, 24 may extend at the interface between the two layers 16a, 16b.

It will be otherwise appreciated that the two (or possibly more) package layers, such as 16a, 16b, may comprise either a same material or different materials.

Figure 4:
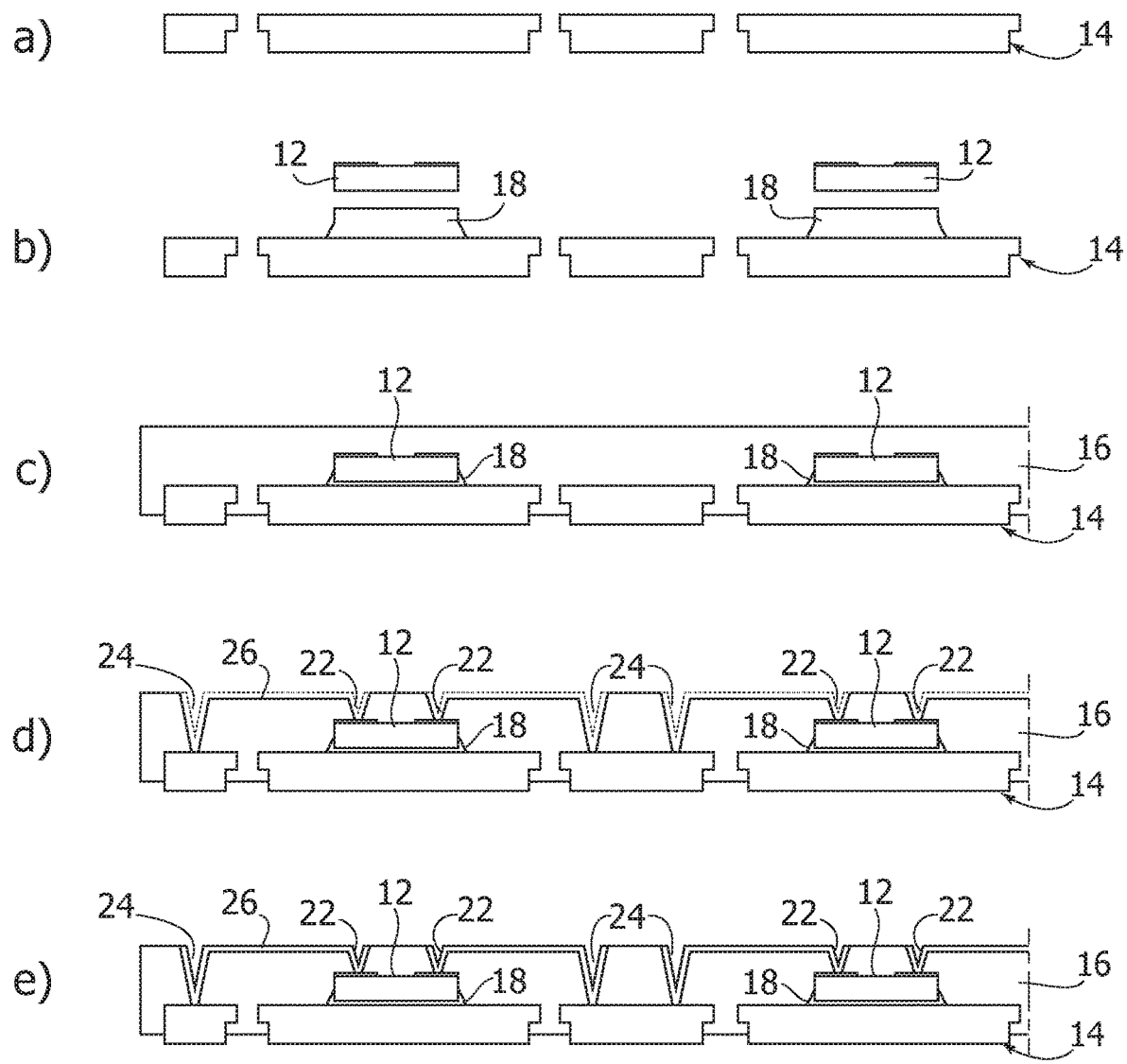
Figure 4:
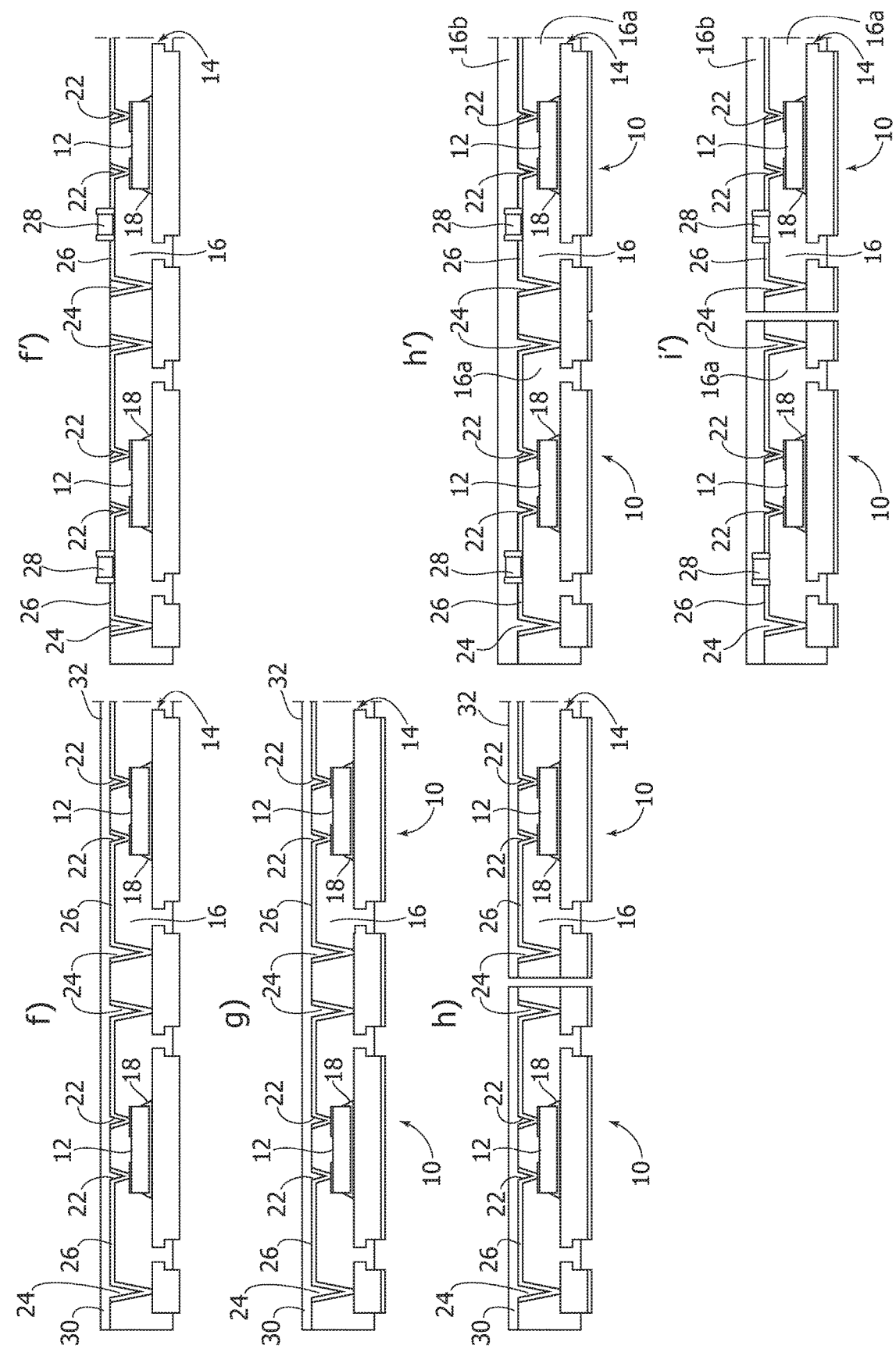

FIG. 4 is exemplary of a possible sequence of acts in a manufacturing process for producing a semiconductor device structure as exemplified in FIG. 3.

The acts (manufacturing steps) exemplified in FIG. 4 have the following meaning:
  a) provision of a (standard) leadframe 14,
  b) glue dispensing (with the standard process) plus die attachment at 18,
  c) molding of package compound 16 (or 16a if multilayer), possibly with additive (e.g., via compression molding),
  d), e) creation of passageways 22, 24 (e.g., via drilling, possibly laser machining of an LDS molding compound to provide vias, also referred to as through openings as shown in FIG. 4d)), as discussed in the following) and lines 26, with subsequent metallization of vias and lines,
  f), f') deposition of a passivation layer 30 (possibly along with the placement of passive components 28, e.g., intermediate the lines—see portion f'),
  g) tin plating,
  h), i) singulation to provide individual devices 10 (possibly after provision of a second molding compound layer 16b embedding 28 as exemplified in h').

Figure 5:
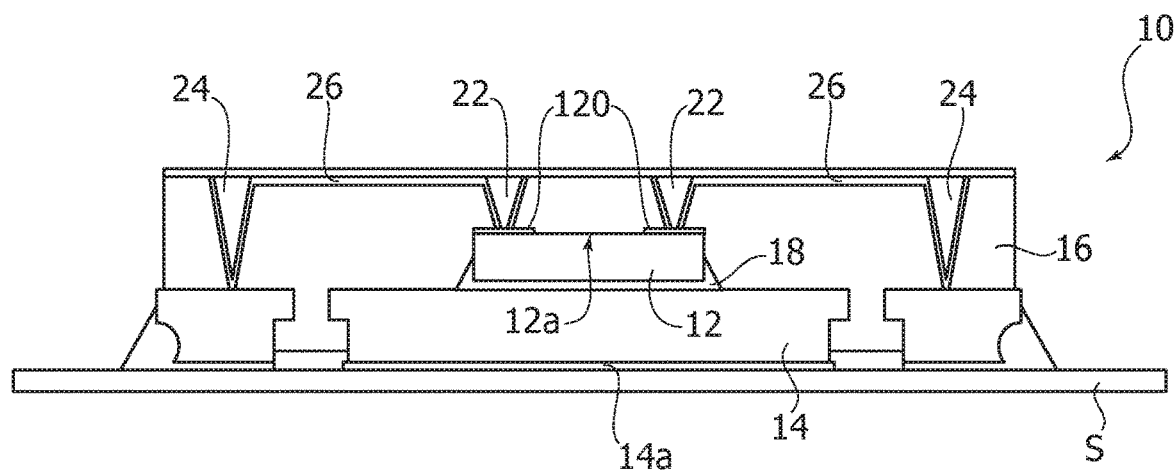
FIGS. 5 and 6 are exemplary of possible features of various embodiments.
Figure 6:
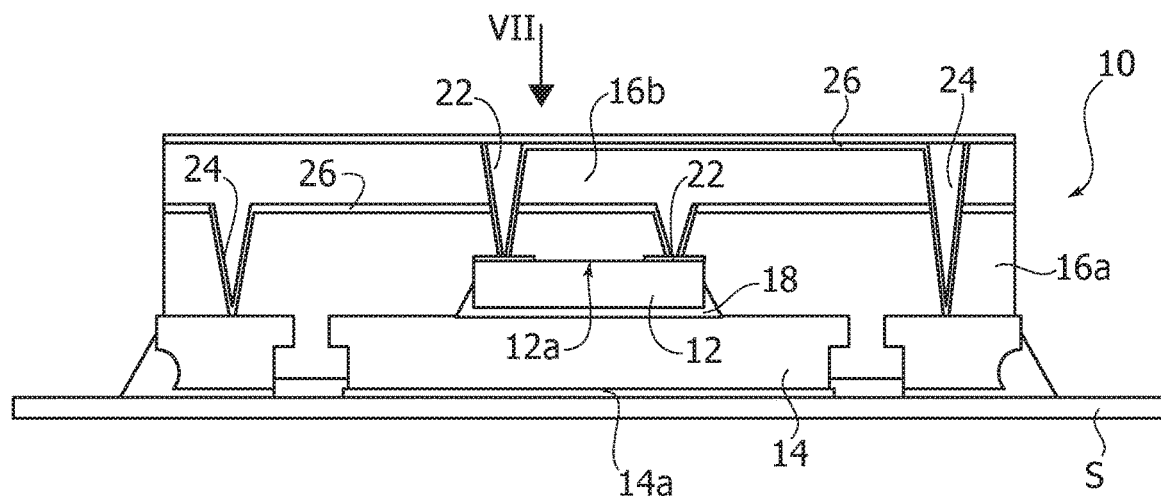
Figure 7:
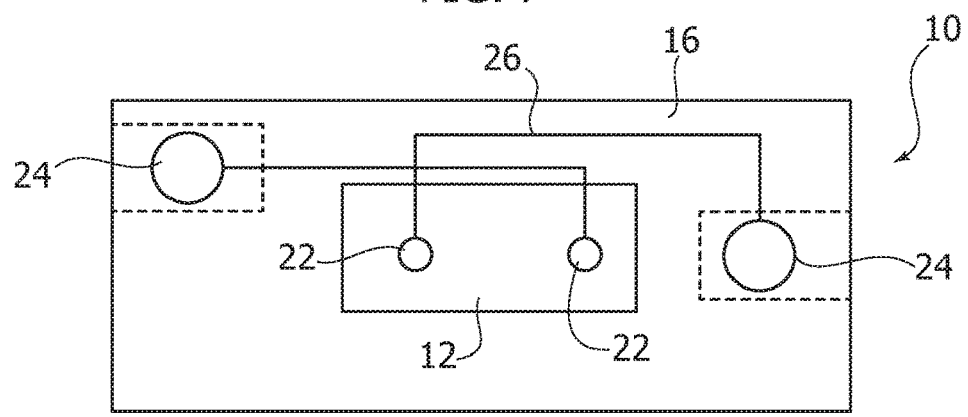
FIG. 7 is a plan view along arrow VII of FIG. 6, FIGS. 8 and 9 are exemplary of possible features of various embodiments.

FIGS. 5 to 7 are exemplary of the possibility of using electrically-conductive passageways 22, 24 and lines 26 to provide electrical coupling paths between the die 12 and the leadframe 14, without having to necessarily rely on the provision of a wire bonding layout as exemplified at 20 in FIG. 2 (the possible combination of passageways, such as 22, and wire bonding 20 is exemplified in FIG. 25, 29, 31 or 37).

FIGS. 5 to 7 exemplify the possibility of creating within a device 10, optionally by resorting to plural molding compound layers (e.g., 16a, 16b), also distant connections and/or cross connections, according to a fairly elaborate pattern, if desired.

Figure 8:
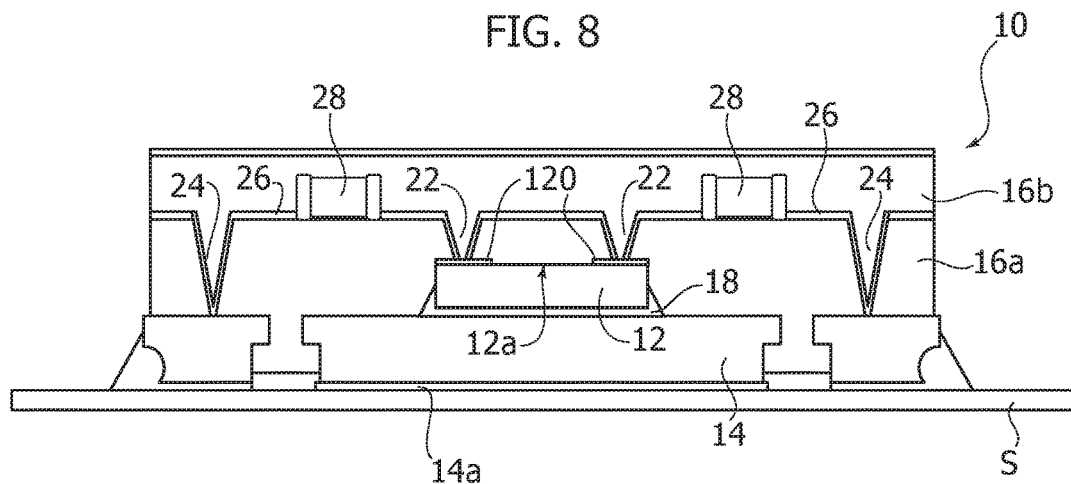
Figure 9:
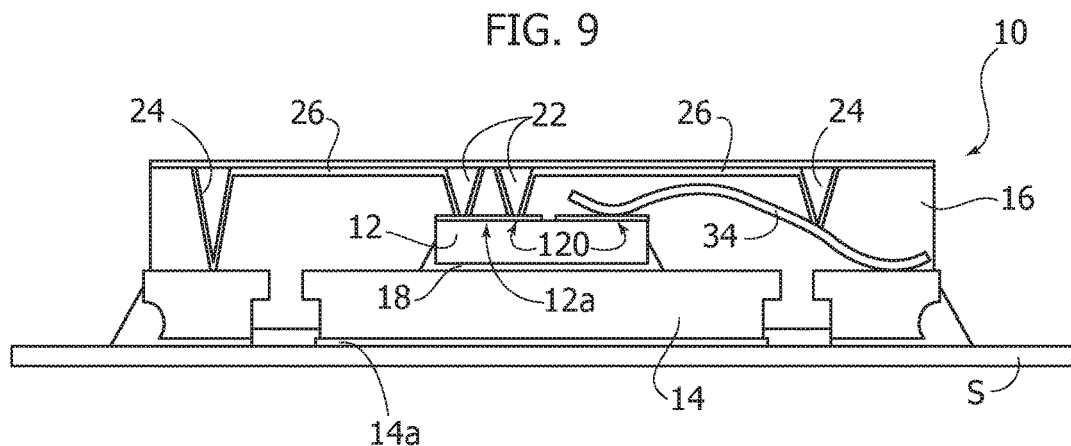

FIGS. 8 and 9 are exemplary of the possibility of extending arrangements as exemplified in FIGS. 5 to 7 to the possible presence of (passive) components 28 while retaining, e.g., the possibility of using RDL layers (e.g., 120, see also FIG. 1).

FIG. 9 is exemplary of the possibility of comprising so-called ribbons as exemplified at 34 extending through the package 16. In one or more embodiments, ribbons such as 34 and electrically-conductive passageways (e.g., 22, 24) may facilitate providing within a same package power supply lines (ribbon 34) and signal lines (passageways 22) to the chip or die 12.

FIG. 9 is exemplary of the possible provision of electrically-conductive passageways (e.g., a "substrate" passageway 24) making contact to a ribbon 34. In one or more embodiments, contact may be with a "chip" passageway 22. In one or more embodiments, ribbons may be provided having no contact with any passageway.

Figure 10:
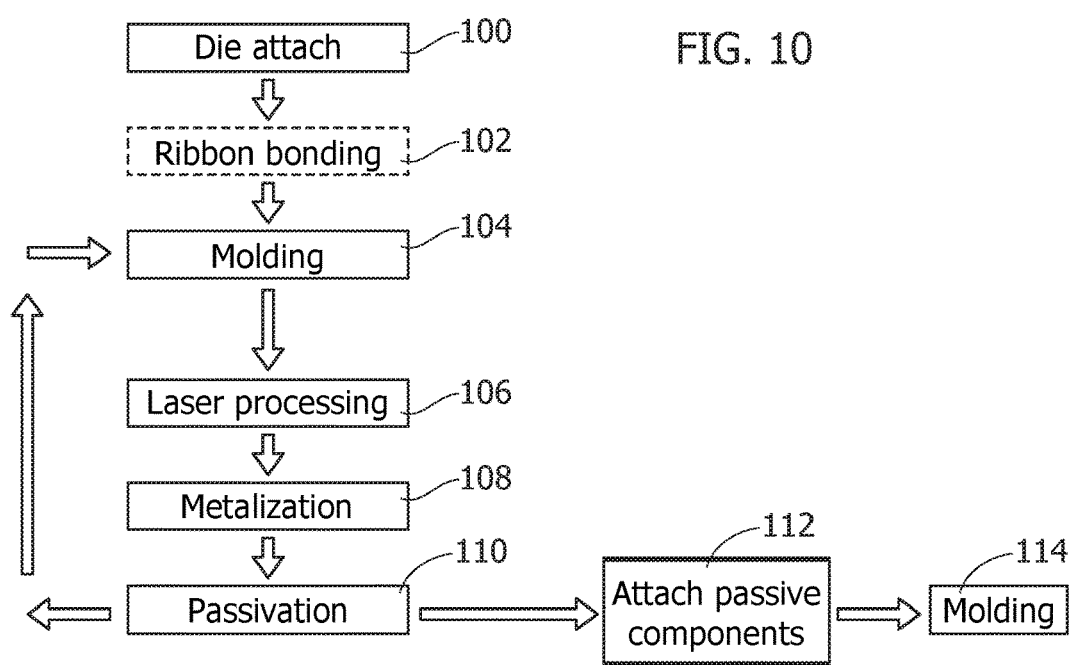
FIG. 10 is a functional diagram exemplary of possible acts or steps in processes which may be used in various embodiments, FIG. 11 comprises portions indicated a) to d) which are exemplary of possible features of elements which may be used in embodiments.

The diagram of FIG. 10 is exemplary of a possible sequence of acts (steps) which may be implemented in a corresponding manufacturing process.

The blocks in the diagram of FIG. 10 have the following meaning:
  100: die attach (attachment of a die 12 onto the lead fame 14), e.g., via gluing 120 or via other means such as spheres or balls (see, e.g., FIG. 1),
  102: ribbon bonding (optional),
  104: molding of, e.g., thermoset packaging material (e.g., LDS laser activatable material),
  106-108: formation of passageways 22, 24 and lines 26, e.g., by laser processing (activation) of LDS material to provide vias therethrough with subsequent metallization,
  110: passivation/protection of electrically-conductive lines,
  112: attachment of a passive components 28 (if contemplated),
  114: possible molding of further packaging material to complete encapsulation of the chip(s) 12 and lines in the packaging material: molding of packaging material can be repeated several times to provide a multi-layer structure, also with different materials.

Figure 11:
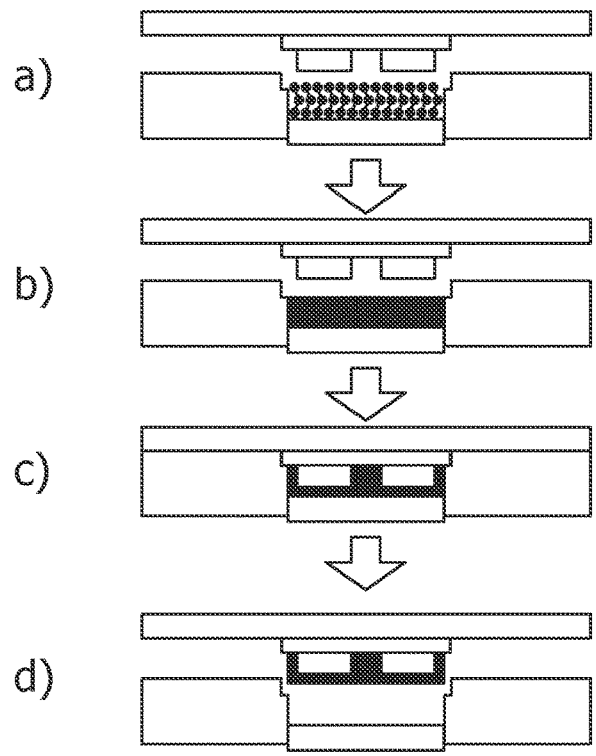

FIG. 11 is schematically exemplary of the formation of an LDS material, e.g., a modified polymer MP comprising additives activatable by laser ablation to provide vias therein.

The acts or steps contemplated in FIG. 11 comprise (in a manner known per se):
  a) granular powder set;
  b) melting;
  c) compression cure;
  d) releasing from formation mold.

It will be appreciated that the representation of FIG. 11 is merely exemplary, insofar as resorting to compression-molded granular material is just one of various options available to those of skill in the art.

Figure 12:
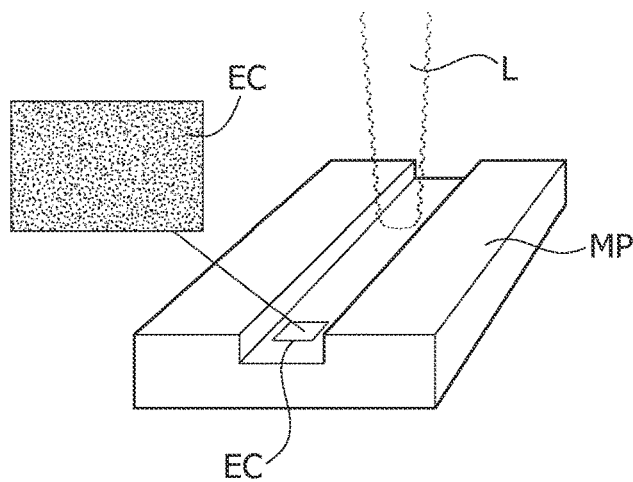
FIGS. 12 and 13 is exemplary of certain technology which may be used in various embodiments.

FIG. 12 is schematically exemplary of laser treatment (application of laser radiation L) to an LDS material (e.g., modified polymer MP) so that additives in the material are activated by laser ablation to provide electrically conductive EC vias, to be possibly further metallized.

Figure 13:
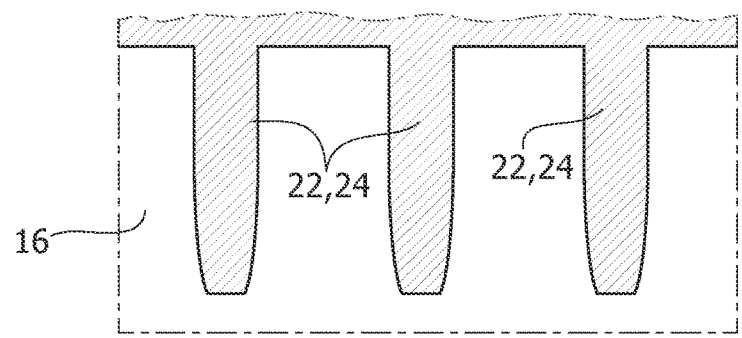

FIG. 13 is exemplary of the possibility of filling (capping) with electrically-conductive material, such as metal like Cu, the vias formed through an electrically-insulating material (e.g., packaging material 16) to provide electrically-conductive passageways such as 22, 24 extending therethrough.

One or more embodiments as exemplified herein make it possible to avoid the use of wire bonding as exemplified at 20 in FIG. 2 (e.g., in a QFN package) providing, e.g., improved flexibility in signal/current distribution.

One or more embodiments may facilitate improved drain-source on resistance (RdsON) performance in field effect transistor (FET) components as possibly comprised in the chip 12, RdsON being a designation for the drain-source resistance in a FET component when ON, that is conductive.

One or more embodiments also facilitate reducing mechanical stress on device pads, while also relaxing active area constraints.

As noted, laser direct structuring (LDS) technology may be used in one or more embodiments in order to create vias and lines in and over an otherwise electrically-insulating packaging material, with the possibility of metalizing such vias and lines to produce electrically-conductive passageways adapted to replace wires as currently used in wire-bonding layouts.

One or more embodiments make it possible to incorporate (embed) in the package passive components such as those exemplified at 28 in the figures.

One or more embodiments retain the possibility of comprising ReDistribution Layers (RDL's—e.g., 120) and ribbon connectors (e.g., 34) within the package.

Figure 14:
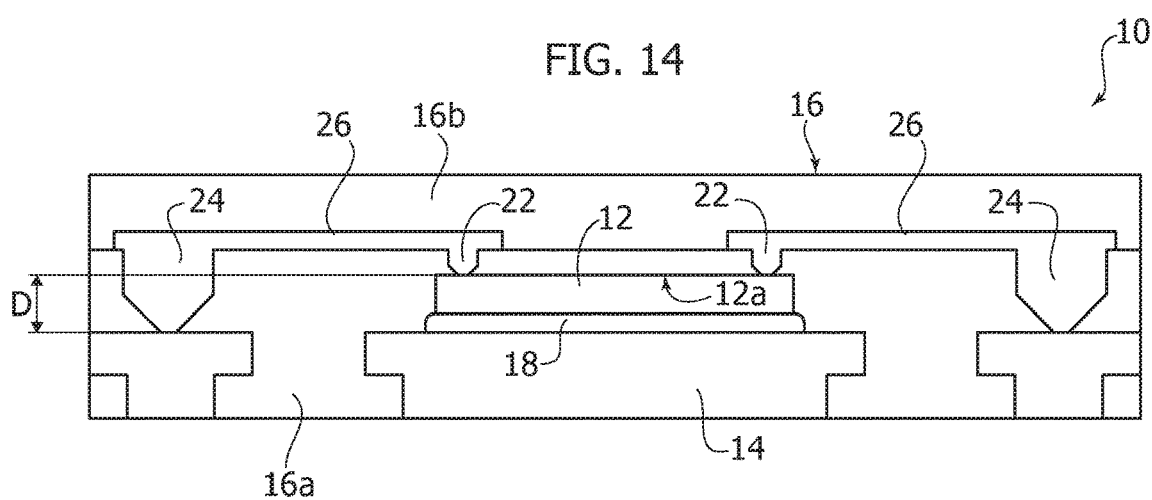
FIGS. 14 and 15 are exemplary of possible features of various embodiments.

FIG. 14 is exemplary of an arrangement where the chip 12 is mounted (attached, e.g., at 18) onto a planar substrate (leadframe 14) so that the first (top or upper) surface 12a of the chip lies in a plane at a distance D from the planar substrate 12.

In such an arrangement the substrate passageways 24 (the passageways towards the leadframe 14) will extend through the packaging material 16 over a longer distance than the chip passageways 22 (the passageways towards the chip 12).

The passageways 22 and 24 extending through the packaging material 16 over (possibly appreciably) different distances, along with these passageways having substantially a similar aspect ratio (width to height ratio L/H, e.g., when provided with vias formed by laser activation of an LDS material) may result in the passageways 24 being appreciably "bigger" than the chip passageways 22. This may result in an undesired effect of making the substrate passageways 24 difficult and/or expensive to be filled with electrically-conductive material (e.g., with copper as exemplified in FIG. 13).

Figure 15:
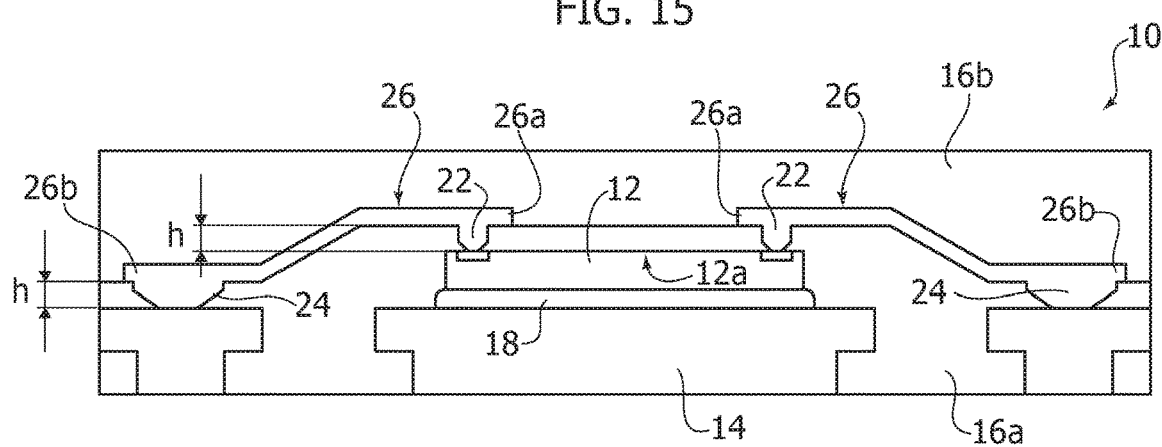

In one or more embodiments these issues may be addressed as exemplified in FIG. 15 that is by causing the electrically-conductive lines 26 to extend radially away from the chip 12 with a sloping profile bent towards the leadframe 14. This is in contrast with rectilinear profile of the lines 26 in FIG. 14, which extend parallel to the plane of the planar substrate (leadframe) 14.

In one or more embodiments as exemplified in FIG. 15 the lines 26 may be provided, e.g., by correspondingly shaping "mesa-like" the molding material 16 (e.g., the proximal layer 16a) in such a way that the lines 26 comprise proximal ends 26a (at the chip passageways 22) and distal ends 26b (at the substrate passageways 24) with an intermediate bent portion 26c sloping towards the planar substrate (e.g., the leadframe 14).

In that way the passageways, both those at the chip 22 and those at the substrate 26 may be provided with a substantially identical depth or height h (e.g., 10-150 micron; 1 micron=$10^{-6}$ m) through the packaging material 16a.

In addition to reducing process costs (less material, e.g., Cu, used to provide a metallization of the vias to produce the passageways 22, 24) and improving robustness of filled vias, embodiments as exemplified in FIG. 15 may facilitate using thick leadframes 14 for power dissipation and enhanced electrical performance (e.g., in high power packaging), reducing package thickness while also having a possible beneficial impact on a circuit fan out and/or facilitating extra insulation with polymer coating or molding.

Figure 16:
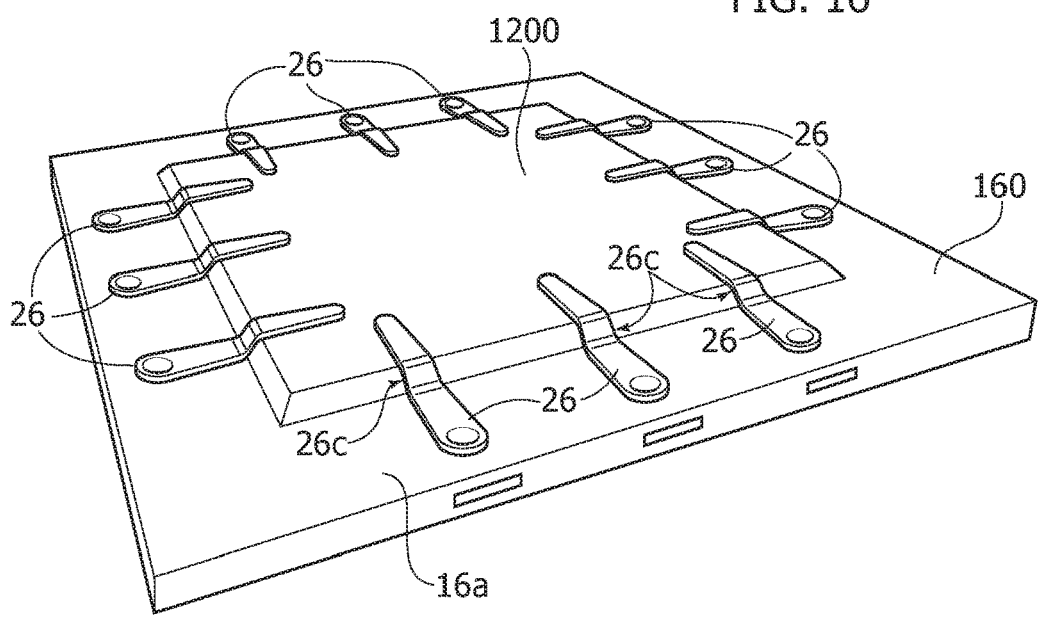
FIG. 16 is a perspective view illustrative of at least one an embodiment, FIG. 17 comprises portions indicated a) to e) which are exemplary of possible acts or steps in at least one embodiment.

In one or more embodiments, a custom mold package cavity can be used with reduced thickness over the die 12 and leadframe 14 in order to provide a step-wise "mesa-like" package layer 16a as schematically represented in FIG. 16. FIG. 16 is exemplary of possible details of plating on such a step-like molding of an, e.g., LDS molding compound 16. In FIG. 16, references 1200 and 160 indicate a die area (that is, an area for attaching the die 12) and a lead area (that is an area for attaching leads) in the, e.g., LDS molding compound.

In one or more embodiments as discussed previously, an RCC (Resin-Coated-Copper) material can be used within the framework of an RCC lamination flow, e.g., to provide another routing level.

Figure 17:
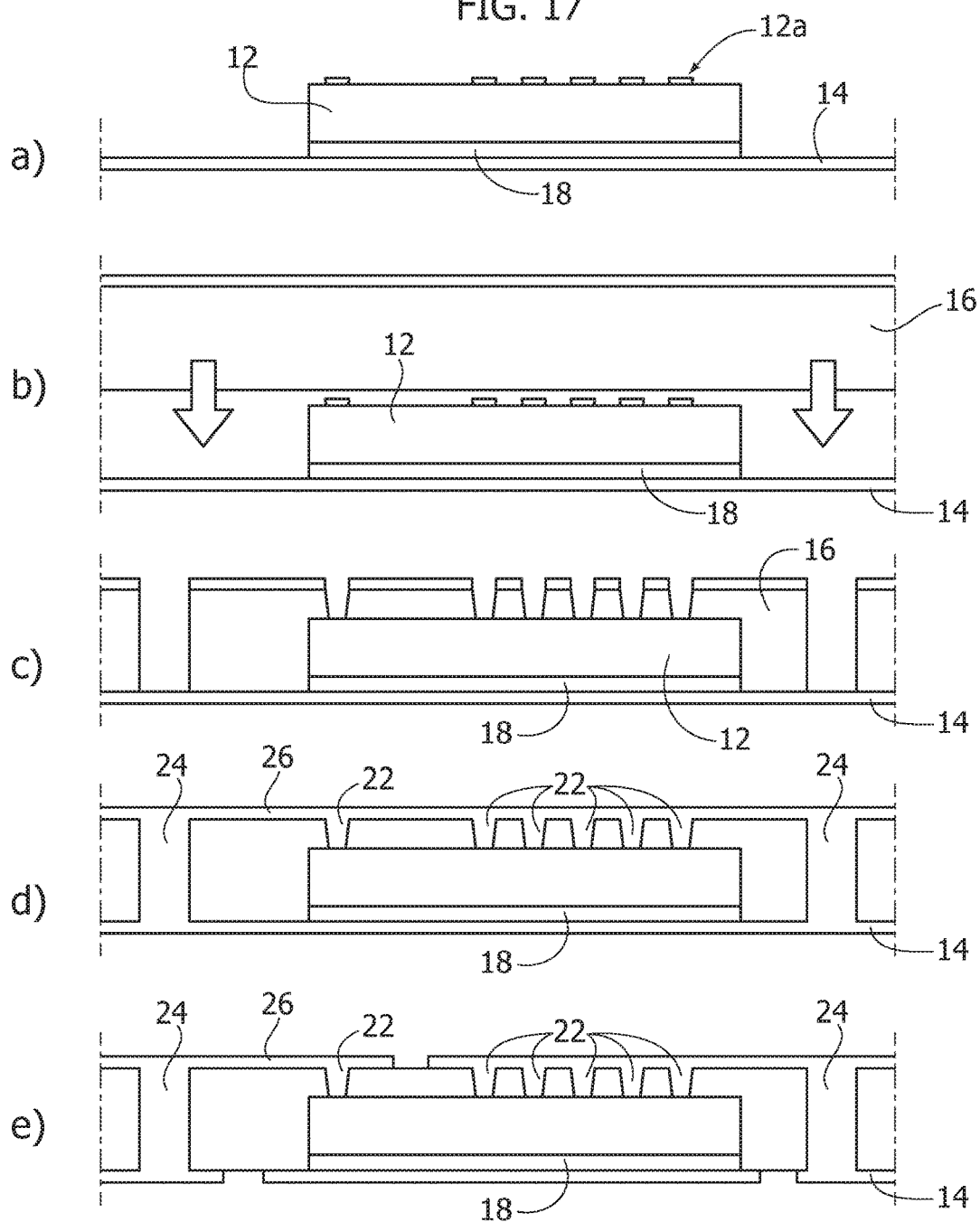

As exemplified in FIG. 17, RCC processing may comprise:
  a) attaching a chip 12 onto a substrate (e.g., leadframe) 14
  b) applying RCC packaging material 16 by, so-to-say, "squeezing" onto the chip 12 followed by vacuum lamination of RCC material;
  c), d) and e) providing vias in the RCC material 16 (e.g., by laser drilling of micro vias) followed by, e.g., copper metallization to provide electrically-conductive chip and substrate passageways 22 and 24 extending through the packaging material 16 towards the chip 12 and towards the substrate (e.g., leadframe 14) with electrically-conductive lines 26 therebetween formed, e.g., by circuit patterning performed in the copper metallization. As shown, such circuit patterning may be applied also to the substrate (leadframe) 14.

Figure 18:
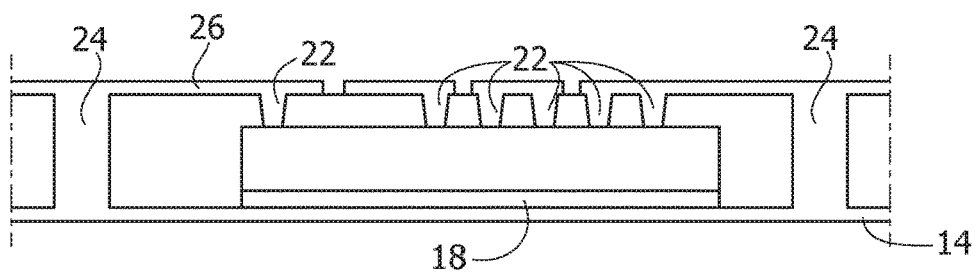
FIG. 18 is exemplary of certain technology which may be used in at least one an embodiment.

FIG. 18 is exemplary of another possibility of circuit patterning at the level of the lines 26.

Figure 19:
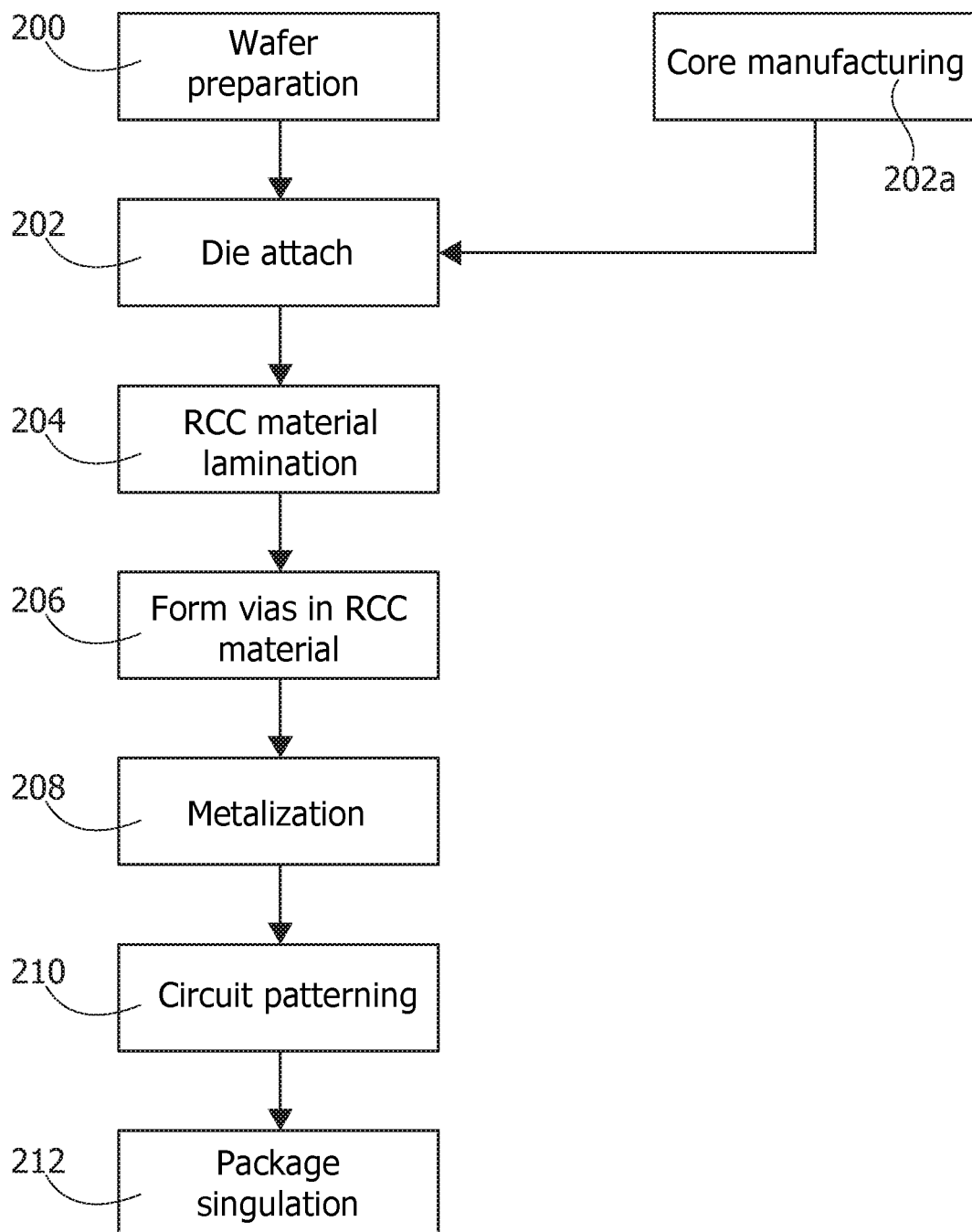
FIG. 19 is a functional diagram exemplary of possible acts or steps which may be performed in various embodiments.
Figure 20:
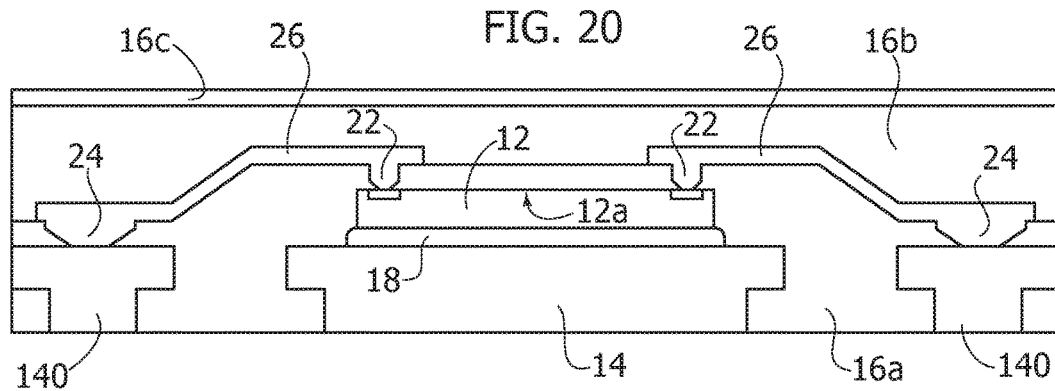
FIGS. 20 to 23 are exemplary of possible features of various embodiments.

The diagram of FIG. 19 is exemplary of possible acts (steps) in a RCC lamination flow a discussed previously.

The blocks in FIG. 19, indicate the following possible acts or steps:
  200: wafer preparation,
  202: die attachment (120, non-conductive or conductive, e.g., spheres or balls) with possible core manufacturing 202a,
  204: RCC lamination,
  206: drilling of vias through the RCC material (e.g., via ultraviolet radiation or UV/$CO_2$ processing),
  208: metallization to provide the electrically-conductive passageways 22, 24,
  210: circuit patterning (e.g., via subtractive processing such as etching of metallization layer or (semi)additive processing such as, e.g., film or the like) to form the lines 26,
  212: package separation (singulation).

In FIGS. 20 to 23, reference 16c is indicative of the possibility of using RCC lamination/patterning to provide circuit patterns for possibly mounting further semiconductor chips or dice 12' "on top" of a structure as discussed previously in a sort of Package-On-Package (POP) arrangement.

Figure 21:
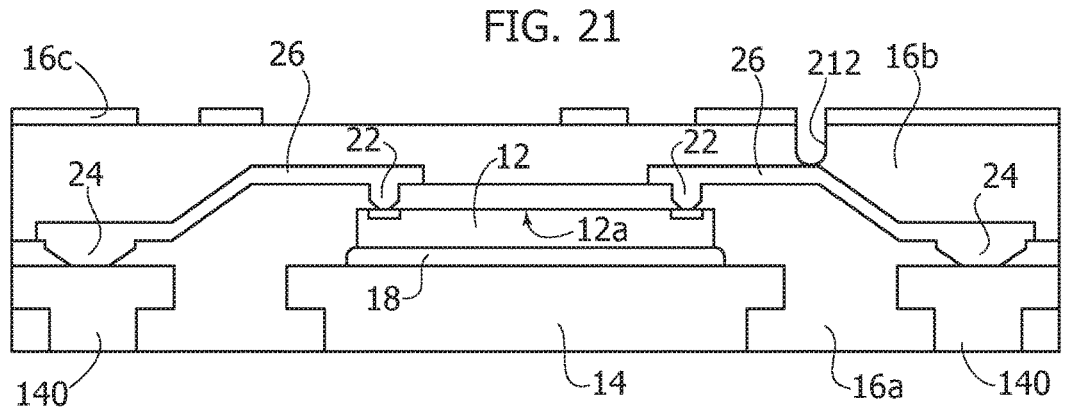
Figure 22:
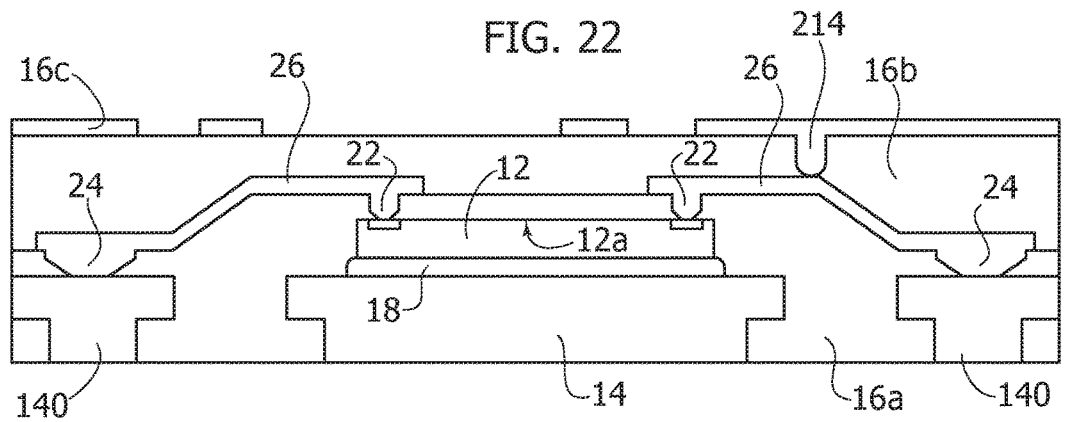

By way of simple example, reference 212 in FIG. 21 is exemplary of the possibility of using drilling processing to provide further vias through the lamination 16c followed by (further) metallization 214 (FIG. 22) with one or more additional chips or dice 12 mounted to the structure (e.g., on top of the structure as exemplified in FIG. 23, e.g., by spheres or balls 18)'.

Figure 23:
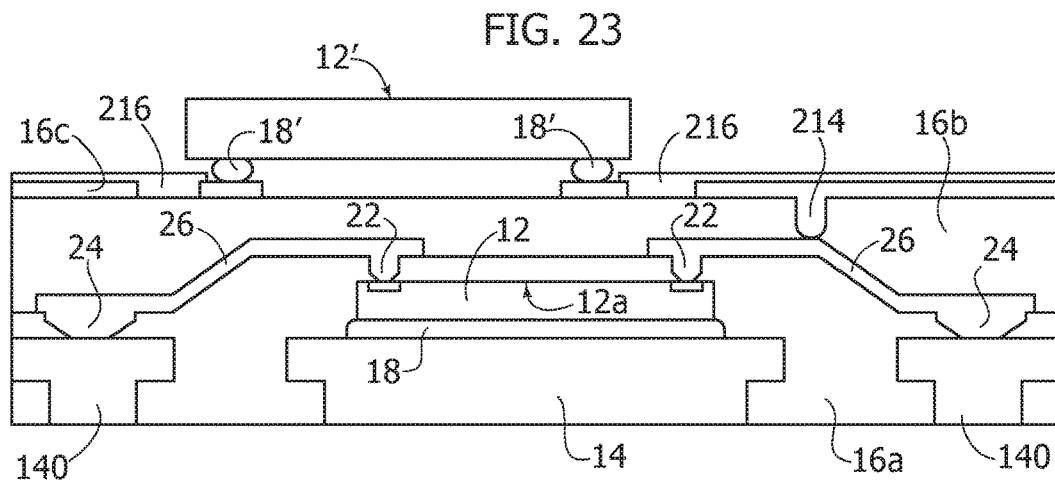
Figure 24:
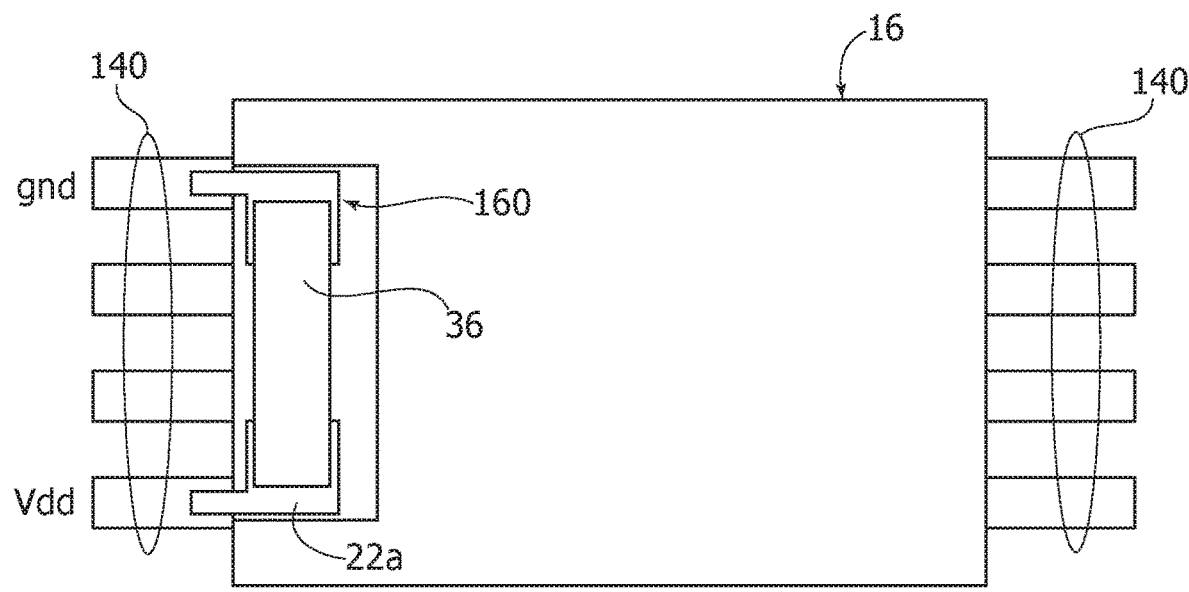
FIG. 24 is a plan view of a semiconductor device exemplary of possible features of at least one an embodiment.

Reference 216 in FIG. 23 denotes possible passivation to protect exposed metal layers. Photoresist or "reserve" layers as possibly involved in lamination/patterning processing as discussed above are not visible in the figures for simplicity.

FIGS. 24 to 37 are exemplary of embodiments wherein the underlying concept of providing electrically-conductive passageways through the packaging material is applied to further expand the possibility of incorporating to a device 10 as exemplified herein passive components as capacitors.

In that respect, it is again remarked that, as noted previously, details and features exemplified, singly or in combination, in any one of the figures annexed herein can be adopted, singly or in combination, in embodiments as exemplified in any one of the other figures. Stated otherwise, details and features exemplified throughout the figures may be freely exchanged between the various embodiments exemplified herein.

One or more embodiments as exemplified in FIGS. 24 to 37 may provide the advantage of reducing the used space for components, such as capacitors 36, by, so-to-say, "removing" them from the PCB (e.g., S) onto which the device 10 is mounted by incorporating those components to the device 10 itself.

Such an arrangement may be advantageous, e.g., in providing a self-stabilized power supply for the device 10.

One or more embodiments as exemplified in FIGS. 24 to 37 provide for the packaging material 16 being configured to host components, such as capacitors 34.

In one or more embodiments, this may involve forming in the package 16 one or more cavities 160 for receiving such components. In one or more embodiments, the cavity or cavities 160 can be provided by means of film-assisted mold process technology with the capability of creating in the cavity traces and lands (that is electrically-conductive passageways) for soldering capacitors 36 thereto.

One or more embodiments as exemplified in FIGS. 24 to 37 facilitate using a same leadframe 14 for plural devices with the possibility of associating additional functions or chip(s) in a same leadframe by also dispensing with the requirement of a custom leadframe to permit internal assembly of components, such as capacitors.

In one or more embodiments, electrically-conductive passageways 22 as exemplified in FIGS. 24 to 37 may be provided by various techniques. Laser structuring, as discussed previously, or ink-printing may be exemplary of such techniques.

Figure 25:
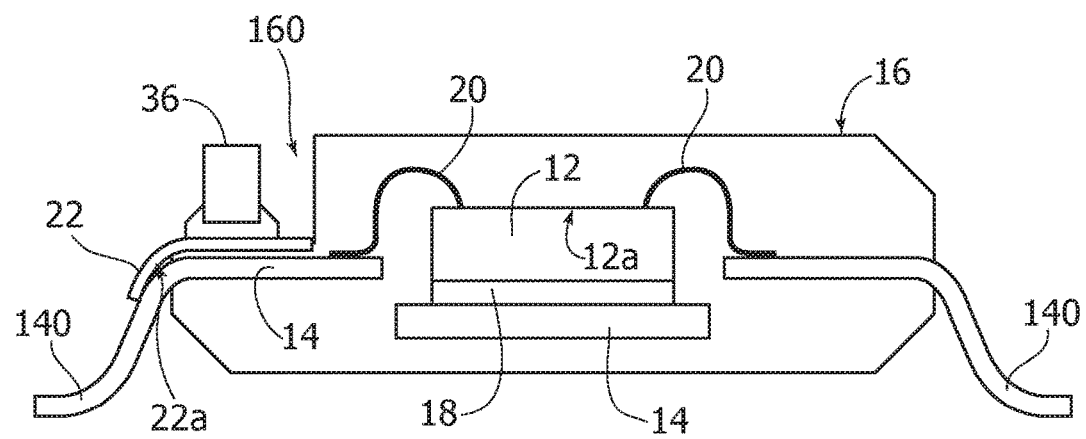
FIG. 25 is a cross-sectional view of a semiconductor device exemplary of possible features of at least one an embodiment.

For instance, FIG. 25 is exemplary of the possibility of providing a contact 22a on the (outer) side of a lead 140 in the leadframe 14 while having otherwise the lead not exposed at the capacitor 36.

Figure 26:
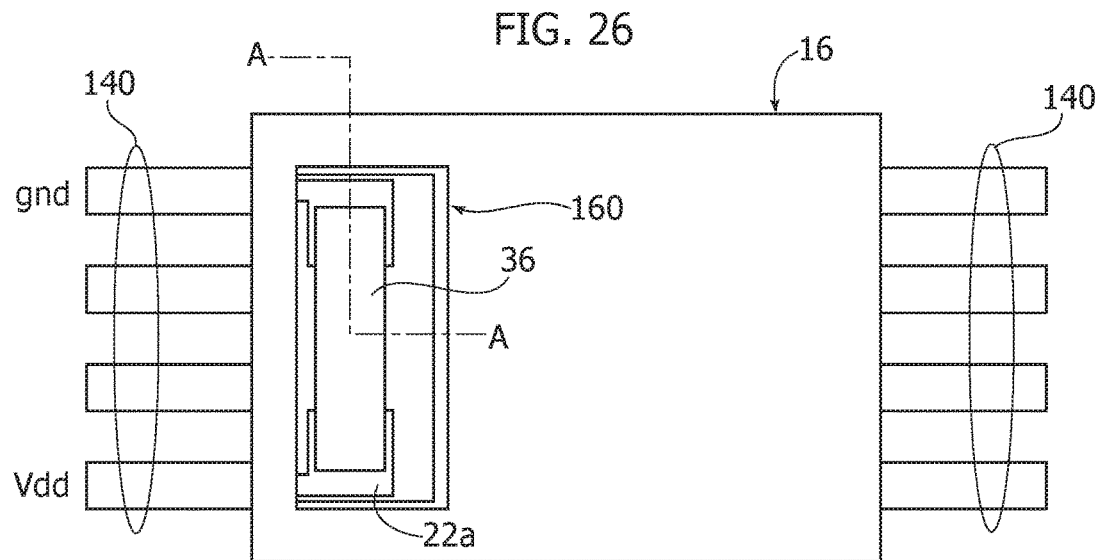
FIG. 26 is a plan view of a semiconductor device exemplary of possible features of at least one an embodiment.
Figure 27:
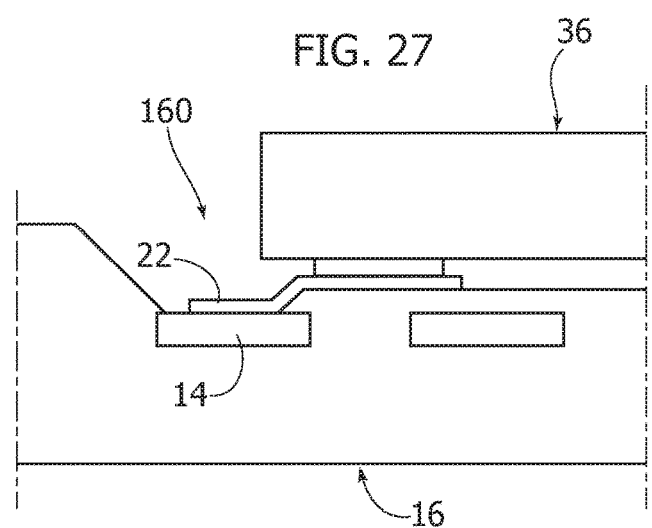
FIGS. 27 and 28 are cross-sectional views essentially along line A-A of FIG. 26.
Figure 28:
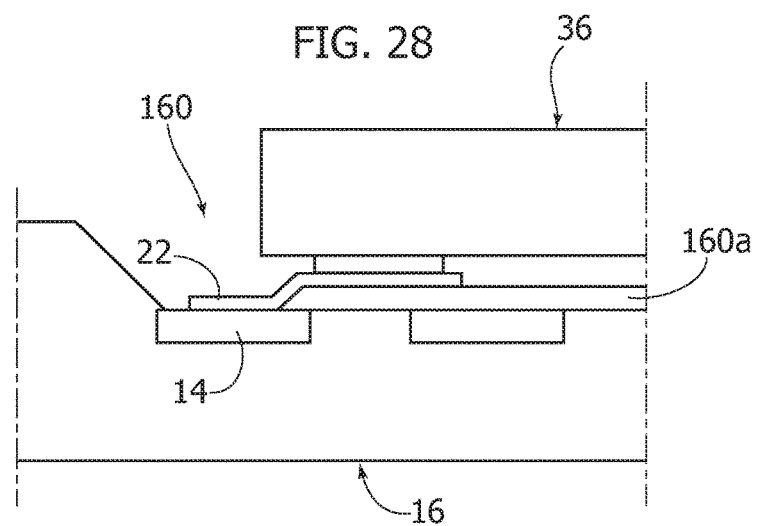

FIGS. 26 to 28 are exemplary of the possibility of using the same basic arrangement both without passivation (see FIG. 27) and with passivation as indicated at 160a (see FIG. 28).

Figure 29:
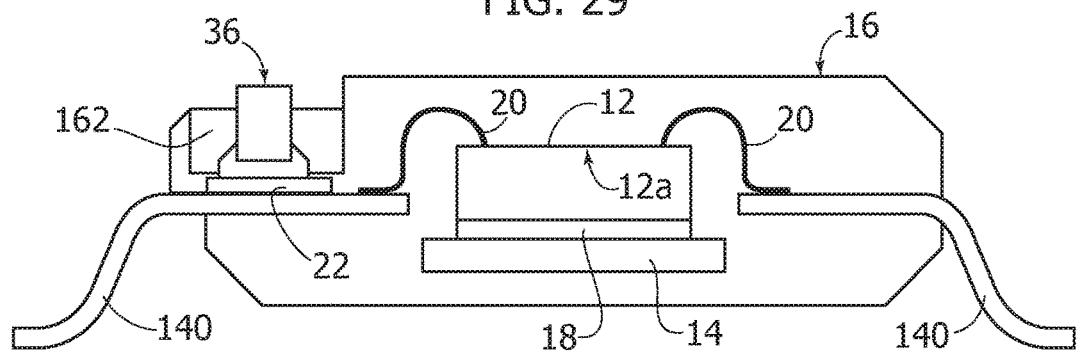
FIG. 29 is a cross-sectional view of a semiconductor device exemplary of possible features of at least one an embodiment.
Figure 30:
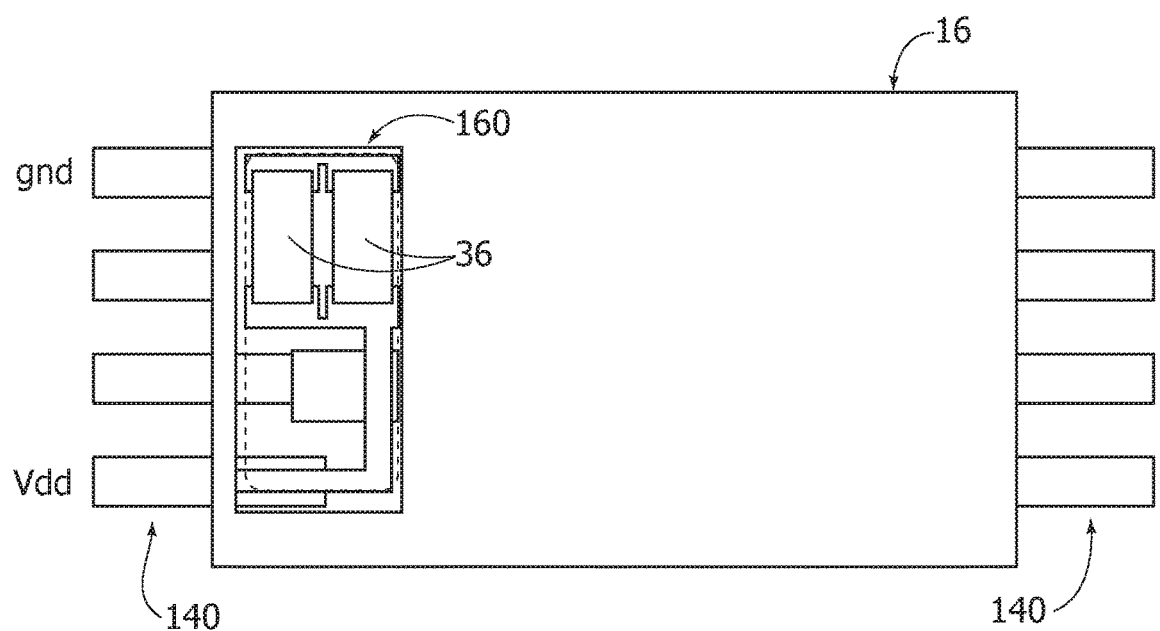
FIG. 30 is a plan view of a semiconductor device exemplary of possible features of at least one an embodiment.

The possible use of (at least partial) encapsulation of the capacitor(s) 36 is exemplified at 162 in FIG. 29.

Figure 31:
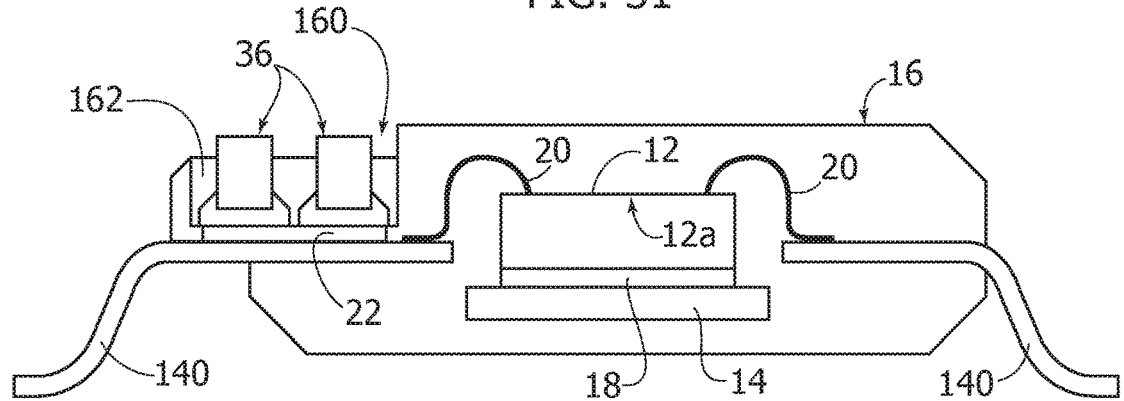
FIG. 31 is a cross-sectional view of a semiconductor device exemplary of possible features of at least one an embodiment.

FIGS. 30 to 37 are exemplary of the possibility of arranging plural components (e.g., capacitors 36) in one or more cavities 160 in the package 16:

at a same location (FIG. 30, FIG. 35) or at different locations (FIG. 31, FIG. 33);

in groups of two (FIGS. 30 to 34, with FIG. 32 indicating the possibility of providing a dielectric separation layer 36a between crossing electrically-conductive lines) or more (FIGS. 35 to 37) as an alternative to the provision of a single capacitor as shown in FIGS. 24 to 29;

at a same level (FIGS. 31 and 37) or at different levels (see FIG. 34).

Figures such as FIG. 25, 29, 31 or 37 are exemplary of the fact that, while devised with the aim of dispensing with wire bonding layouts 20 as exemplified in FIG. 2, one or more embodiments may be nonetheless compatible with such layout whenever this can be held desirable, while retaining the provision of electrically-conductive passageways (such as the passageways 22 visible in several of the FIGS. 24 to 37) provided in the packaging material 16, possibly extending towards the first surface 12a of the semiconductor chip 12 and/or providing (electrical) contact at the first surface 12a (e.g., via wire bonding 20).

It is again recalled that features here illustrated (singly or in combination) in connection with embodiments as exemplified in any one of the figures can be applied (singly or in combination) in connection with embodiments as exemplified in any other of the figures.

A method according to one or more embodiments may comprising:

providing at least one semiconductor chip (e.g., 12) having first (e.g., 12a) and second (e.g., 12b) opposed surfaces, coupling (e.g., at 18) the at least one semiconductor chip with a support substrate (e.g., a leadframe 14, 140) with the second surface towards the support substrate, embedding the at least one semiconductor chip coupled with the support substrate in electrically-insulating packaging material (e.g., 16 or 16a, 16b, multilayer) and providing in the packaging material electrically-conductive passageways (e.g., by forming such passageways after embedding the semiconductor chip(s) coupled with the support in electrically-insulating packaging material), wherein the electrically-conductive passageways comprise:

electrically-conductive chip passageways (e.g., 22) towards the first surface of the at least one semiconductor chip, and/or electrically-conductive substrate passageways (e.g., 24) towards the support substrate.

In one or more embodiments electrically-conductive lines (e.g., 26) may be provided (e.g., extending bridge-like) between selected ones of electrically-conductive chip passageways towards the first surface of the at least one semiconductor chip and selected ones of electrically-conductive substrate passageways towards the support substrate.

One or more embodiments may comprise:

providing a planar support substrate (e.g., 14) with the first surface of the at least one semiconductor chip lying in a plane at a distance (see, e.g., D in FIG. 14) to the planar support substrate, providing electrically-conductive lines (e.g., 26) with opposed ends (e.g., 26a, 26b) at the electrically-conductive chip passageways and at the electrically-conductive substrate passageways, respectively, and a bent portion (e.g., 26c) between the opposed ends (e.g., with a S- or Z-shape overall), the bent portion sloping towards the planar substrate (see, e.g., FIG. 15) wherein the electrically-conductive chip passageways and the electrically-conductive substrate passageways at said opposed ends have substantially identical depths (see, e.g., h in FIG. 15) through the packaging material (16).

In one or more embodiments, the packaging material may comprise (see, e.g., FIG. 3) a first layer (e.g., 16*a*) and a second layer (e.g., 16*b*) arranged proximal and distal to each other with respect to the support substrate, wherein said electrically-conductive passageways extend through the first, proximal layer, with the second, distal layer exempt from electrically-conductive passageways therethrough (e.g., with electrically-conductive lines between the electrically-conductive passageways extending at the interface between the first layer and the second layer).

In one or more embodiments, the first layer of packaging material may be provided with a mesa-like structure with stepwise sides (see, e.g., FIGS. 15 and 16) with electrically-conductive lines (e.g., 26) having bent portions (e.g., 26*c*) sloping towards the planar substrate at said sides.

In one or more embodiments, the electrically-conductive passageways in the packaging material may be provided by:
- opening (see, e.g., part d) of FIG. 4, step 106 in FIG. 10, part c) of FIG. 17, step 206 in FIG. 19), optionally via laser beam machining (see, e.g., L in FIG. 12) vias in the packaging material, and
- metallizing (see, e.g., parts e) and f) of FIG. 4, step 108 in FIG. 10, FIG. 13, part d) of FIG. 17, step 208 in FIG. 19) the vias opened in the packaging material.

In one or more embodiments, the packaging material may comprises, at least at the passageways:
- laser-activatable, direct structuring material (see, e.g., FIGS. 10 to 12), or
- resin-coated-copper (RCC) material (see, e.g., FIGS. 17 to 19).

In one or more embodiments, passive electrical components (see, e.g., 28 or capacitors 36) are coupled with electrically-conductive passageways through the packaging material.

In one or more embodiments, the passive components may be embedded in one of the packaging material (16, see, e.g., FIG. 3) and encapsulation material (see, e.g., 162 in FIG. 29 or 31).

In one or more embodiments, the electrical passive components may be arranged at positions selected out of:
- electrically-conductive lines between selected ones of electrically-conductive chip passageways towards the first surface of the at least one semiconductor chip and selected ones of electrically-conductive substrate passageways towards the support substrate (see, e.g., FIG. 3), and/or
- cavities (e.g., 160) formed in the packaging material (see, e.g., FIGS. 24 to 37).

In one or more embodiments, electrical contact of the electrically-conductive chip passageways to the first surface of the at least one semiconductor chip may be provided via direct contact (see, e.g., the passageways 22 in FIGS. 8 and 9 that contact the redistribution layer 120 at the surface 12*a*) or (indirectly) via wire bonding (see, e.g., 20 in FIG. 25, 29 or 32).

In one or more embodiments, a semiconductor device may comprise:
- at least one semiconductor chip having first and second opposed surfaces, the at least one semiconductor chip coupled with a support substrate (e.g., a leadframe 14, 140) with the second surface towards the support substrate and embedded in electrically-insulating packaging material with electrically-conductive passageways provided in the electrically-insulating packaging material, wherein the electrically-conductive passageways comprise:
  - electrically-conductive chip passageways towards the first surface of the at least one semiconductor chip (12), and/or
  - electrically-conductive substrate passageways towards the support substrate.
- wherein the device may be produced with the method of one or more embodiments.

An electrical circuit according to one or more embodiments may comprise one or more semiconductor devices according to one or more embodiments.

Without prejudice to the underlying principles, the details and embodiments may vary, even significantly, with respect to what has been described by way of example only, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
coupling a semiconductor chip to a support;
molding an LDS material over the semiconductor chip and the support substrate;
using a laser, forming a first through opening and a second through opening in the LDS material, wherein the first through opening exposes a bond pad of the semiconductor chip and the second through opening exposes a contact of the support; and
depositing conductive material in the first and second through openings and on a surface of the LDS material, the conductive material on the surface of the LDS material forming first and second conductive lines, the first and second conductive lines being coupled to the conductive material in the first and second through openings, respectively.

2. The method of claim 1, wherein a depth of the first through opening and a depth of the second through opening are different.

3. The method of claim 1, further comprising forming a passivation layer over the first and second conductive lines and over the conductive material in the first and second through openings.

4. The method of claim 1, wherein molding the LDS material comprises molding a first layer over the semiconductor chip and the support substrate and molding a second layer on an opposing side of the support, wherein the first and second through openings extend through the first layer.

5. The method of claim 4, wherein the first layer includes a step, the method further comprising forming a conductive line on the surface of the LDS material and on the step.

6. The method of claim 1, wherein using the laser comprises using laser beam machining that activates additives in the LDS material to form a metalized surface in the first and second through openings.

7. The method of claim 1, wherein the conductive material is copper.

8. A method, comprising:
coupling a semiconductor chip to a support;
molding an LDS material over the semiconductor chip and the support substrate;
using a laser, forming a through opening in the LDS material, wherein a bond pad of the semiconductor chip or a contact of the support is exposed by the through opening;
depositing conductive material in the through opening, and
coupling passive components to the LDS material.

9. The method of claim 8, further comprising embedding the passive components in a packaging material.

10. A semiconductor device, comprising:
a support;
a semiconductor chip having first and second opposing surfaces, the semiconductor chip coupled to the support with the second surface facing the support; and
electrically-insulating LDS molding material having a plurality of passageways, wherein the plurality of passageways include:
a first passageway at a bond pad on the first surface of the semiconductor chip, wherein the first passageway includes a first layer of laser activated LDS molding material and a second layer deposited on the first layer; and
a second passageway at a contact of the support, wherein the second passageway includes a first layer of laser activated LDS molding material and a second layer deposited on the first layer.

11. The semiconductor device of claim 10, wherein the second layers of the first and second passageways are made of conductive material.

12. The semiconductor device of claim 10, wherein the first and second layers of the first and second passageways completely fill the first and second passageways.

13. The semiconductor device of claim 12, wherein the second layers of the first and second passageways are made of insulating material.

14. The semiconductor device of claim 13, wherein the insulating material is a LDS molding material or a passivation material.

15. A semiconductor device, comprising:
a support;
a semiconductor chip coupled the support;
electrically-insulating LDS molding material covering the support and semiconductor chip;
first and second through openings in the electrically-insulating LDS molding material; and
first and second electrically-conductive passageways in the first and second through openings in the electrically-insulating LDS molding material, wherein the first and second electrically-conductive passageways include a first layer of material that is an additive of the LDS molding material and a second layer deposited on the first layer, wherein the first electrically-conductive passageway is coupled to a bond pad on the first surface of the semiconductor chip.

16. The semiconductor device of claim 15, wherein the second electrically-conductive passageway is coupled to a contact of the support.

17. The semiconductor device of claim 16, wherein the first and second electrically-conductive passageways do not fill the first and second through openings, wherein a passivation material or a molding material is located in the first and second through openings covering the first and second electrically-conductive passageways.

18. The semiconductor device of claim 17, further comprising a conductive line a surface of the electrically-insulating LDS molding material, the conductive line coupling the first electrically-conductive passageway to the second electrically-conductive passageway.

19. The semiconductor device of claim 18, wherein the bond pad of the semiconductor chip is a first bond pad, further comprising a ribbon coupled to a contact of the support and a second bond pad of the semiconductor die, wherein the second through opening is over the ribbon, wherein the second electrically-conductive passageway is coupled to the ribbon.

* * * * *